(12) United States Patent
Gross et al.

(10) Patent No.: US 7,487,058 B2
(45) Date of Patent: Feb. 3, 2009

(54) GENERATING SYNTHETIC WORKLOADS TO MEASURE POWER UTILIZATION IN A COMPUTER SYSTEM

(75) Inventors: Kenny C. Gross, San Diego, CA (US); Ramakrishna C. Dhanekula, San Diego, CA (US); Kalyanaraman Vaidyanathan, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/725,006

(22) Filed: Mar. 15, 2007

(65) Prior Publication Data
US 2008/0228462 A1 Sep. 18, 2008

(51) Int. Cl.
G06F 19/00 (2006.01)
G01L 25/00 (2006.01)
G01M 7/00 (2006.01)
G01C 25/00 (2006.01)

(52) U.S. Cl. .................... 702/113; 702/109; 702/186; 700/28; 700/36; 700/99; 703/21; 717/151

(58) Field of Classification Search ............... 702/109, 702/112, 120, 182, 186; 700/28, 36, 99; 703/21; 717/151
See application file for complete search history.

(56) References Cited

U.S. PATENT DOCUMENTS 6,789,049 B2 * 9/2004 Gross et al. ............... 702/186

OTHER PUBLICATIONS

Roberts et al., 'Performance Testing of Communication Protocols for Three-Tier Computing Results for ICA and X-Windows Protocols', 1997, IEEE Publication, pp. 450-455.*
Oldham, 'A Power and Performance Measurement Framework for Server-Class Storage', 2005, FSU, pp. 1-24.*

* cited by examiner

Primary Examiner—Edward Raymond
Assistant Examiner—Elias Desta
(74) Attorney, Agent, or Firm—Park, Vaughan & Fleming LLP

(57) ABSTRACT

One embodiment of the present invention provides a system that generates a synthetic workload to test power utilization in a computer system. During operation, the system monitors power utilization of a reference computer system while the reference computer system executes a workload-of-interest, wherein the monitoring process produces a power profile. Next, the system determines characteristics of the workload-of-interest from the power profile. Finally, the system uses the determined characteristics to construct the synthetic workload, wherein the synthetic workload has similar power utilization to the workload-of-interest.

22 Claims, 6 Drawing Sheets

(12) United States Patent
US 7,487,058 B2

GENERATING SYNTHETIC WORKLOADS TO MEASURE POWER UTILIZATION IN A COMPUTER SYSTEM

BACKGROUND

1. Field of the Invention

The present invention generally relates to techniques for testing computer systems. More specifically, the present invention relates to techniques for synthesizing dynamic workloads to test power utilization in computer systems.

2. Related Art

Large organizations often maintain datacenters containing dozens or even hundreds of servers that provide various computational services. As these servers become increasingly more powerful, they consume more power, which can greatly increase electricity costs. In fact, as power consumption continues to increase, electricity costs are likely to exceed both capital costs and operating costs to become the largest component of the total cost of ownership (TCO) of a data center.

Hence, the total wattage, and the integrated wattage needed to complete a given computational workload are becoming key factors in determining what servers to purchase. To this end, customers are beginning to ask for more information than is conveyed by total face-plate wattage for servers or blades. These customers are knowledgeable enough to realize that the power they will use depends upon their own dynamic workloads. The power used by these dynamic workloads could be significantly different than the power used by a benchmark that a vendor uses to determine power consumption. Consequently, customers are interested in knowing how much power is required to run their exact workload on different server products.

Responding to such queries from customers is not easy. To accurately determine how much power is used to execute a customer's workload on a server, it is typically necessary to duplicate the customer's workload on the server. However, duplicating a customer's exact workload on one or more servers in a laboratory is most often not possible. First, there are security concerns that would prevent most business customers from allowing a vendor to port financial, health-care, or business-proprietary databases to a vendor's lab. Secondly, it is a huge undertaking to duplicate a customer's software systems (e.g., database, enterprise computing software, or nuclear simulation) on a vendor's machines in a laboratory for purposes of assessing energy utilization.

Hence, what is needed is a method and an apparatus for determining how much power is used by a server while executing a workload-of-interest without the problems described above.

SUMMARY

One embodiment of the present invention provides a system that generates a synthetic workload to test power utilization in a computer system. During operation, the system monitors power utilization of a reference computer system while the reference computer system executes a workload-of interest, wherein the monitoring process produces a power profile. Next, the system determines characteristics of the workload-of-interest from the power profile. Finally, the system uses the determined characteristics to construct the synthetic workload, wherein the synthetic workload has similar power utilization to the workload-of-interest.

In some embodiments of the present invention, determining the characteristics of the workload-of-interest involves performing a spectral decomposition on the power profile to produce a set of coefficients. In these embodiments, the system uses the set of coefficients to construct the synthetic workload.

In some embodiments of the present invention, performing the spectral decomposition involves using the Fourier technique, and producing the set of coefficients involves producing coefficients for M largest Fourier harmonics produced by the Fourier technique.

In some embodiments of the present invention, using the set of coefficients to construct the synthetic workload involves constructing a workload comprised of M sinusoidal workloads corresponding to the M largest Fourier harmonics.

In some embodiments of the present invention, monitoring the power utilization of the reference computer system involves: periodically polling current sensors and associated voltage sensors within the reference computer system to generate dynamic traces of currents and associated voltages within the reference computer system; and generating a dynamic trace of total power consumption of the reference computer system based on the dynamic traces of the currents and associated voltages.

In some embodiments of the present invention, monitoring the power utilization of the reference computer system involves using a power meter interposed between the reference computer system and a power source to monitor the power utilization.

In some embodiments of the present invention, monitoring the power utilization of the reference computer system involves monitoring instrumentation signals within the reference computer system, wherein the instrumentation signals do not include corresponding current and voltage signals that can be used to directly compute power consumption. Next, the system estimates the power consumption for the computer system by inferring the power consumption from the instrumentation signals and from an inferential power model generated during a training phase.

In some embodiments of the present invention, the system estimates the power utilization of a target computer system by: executing the synthetic workload on the target computer system, and monitoring the power utilization of the target computer system while the synthetic workload is executing.

In some embodiments of the present invention, monitoring the power utilization of the reference computer system additionally involves monitoring the relative mix between floating-point and integer operations as the reference computer system executes the workload-of-interest. In these embodiments, constructing the synthetic workload involves using the relative mix information to synthesize separate floating-point and integer components of the synthetic workload.

DETAILED DESCRIPTION

Figure 1:
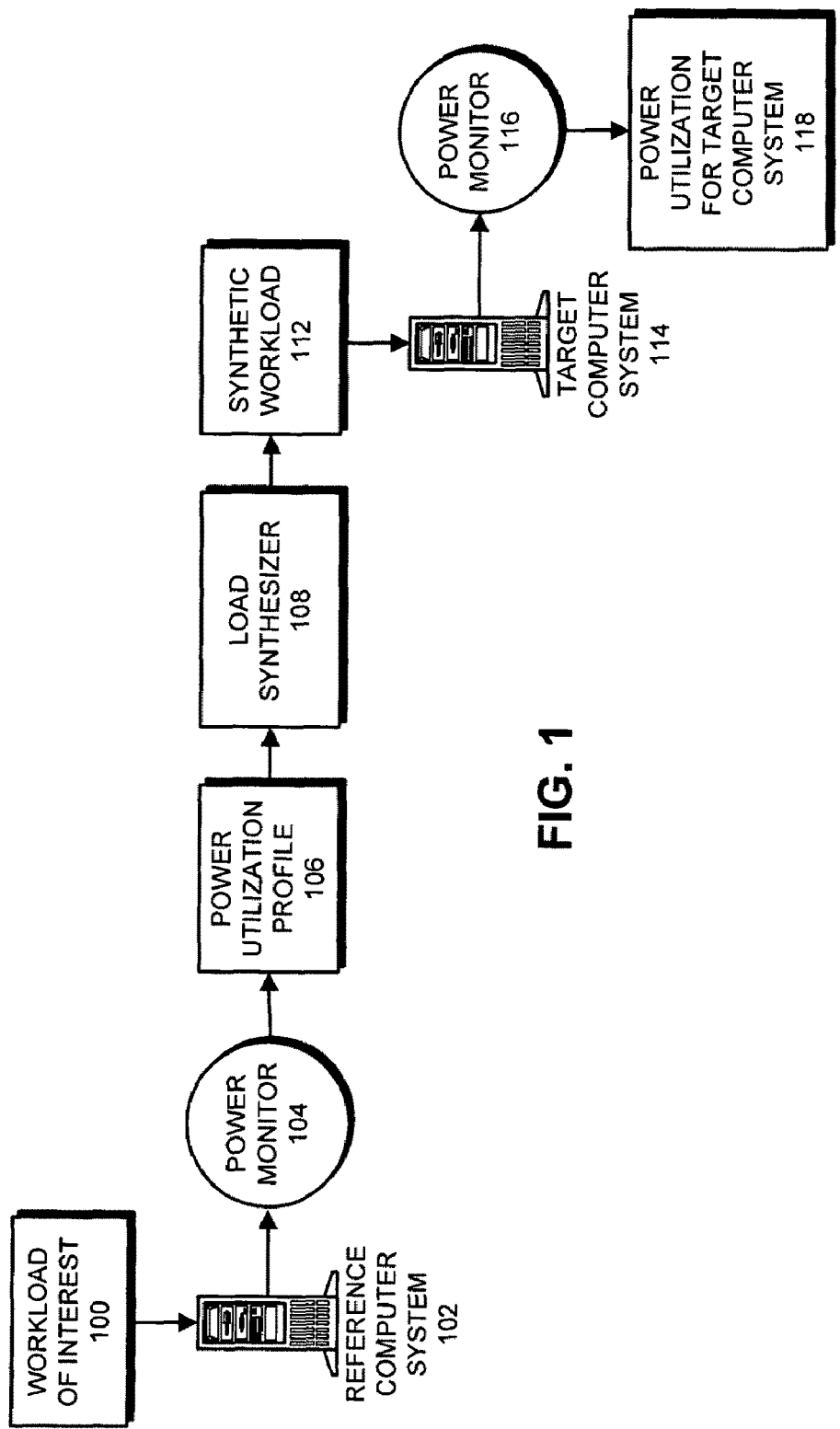
FIG. 1 illustrates the process of estimating the power utilization of a target computer system while executing a workload-of-interest in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Overview

Embodiments of the present invention provide a novel technique for synthesizing a customer's workload dynamics without the need to access any of the customer's sensitive data or software. The synthesized workload can then be run on a range of server products to determine how much integrated energy (kW-hrs) will be used on the different server products.

Another use for such synthetic workloads is for more realistic quality testing of server products. For example, if a customer's servers are experiencing higher than expected failures (or higher rates of No-Trouble-Found events), there is a possibility that the customer's usage profile is more stressful than the test suites that were used to quality test the servers. Embodiments of the present invention construct a synthetic workload which closely matches the actual workload dynamics, and thereby facilitates performing root cause analysis operations.

Embodiments of the present invention use software or hardware mechanisms on the customer's machine to capture dynamic power utilization on that machine while the customer is running their own software suite. Next, on a laboratory machine, spectral decomposition is applied to the measured workload profile. Spectral decomposition is a technique that decomposes the customer's dynamic workload profile into sinusoidal components through a Fourier series expansion. During this process, the system determines the highest M harmonics and corresponding Fourier coefficients.

The system uses the Fourier coefficients to reconstruct a synthesized workload which comprises an envelope of superimposed sinusoids that, when run on the laboratory machine, sum up to closely approximate the same power dynamics as the customer's software did on the customer's machine.

In one embodiment of the present invention, if there is a mix of integer and floating point operations in the customer's workload, the relative mix is monitored on the customer's machine. Then, the integer dynamics and the FP dynamics are separately synthesized using the above procedure and run simultaneously on the laboratory machine.

Estimating Power Utilization

Figure 2:
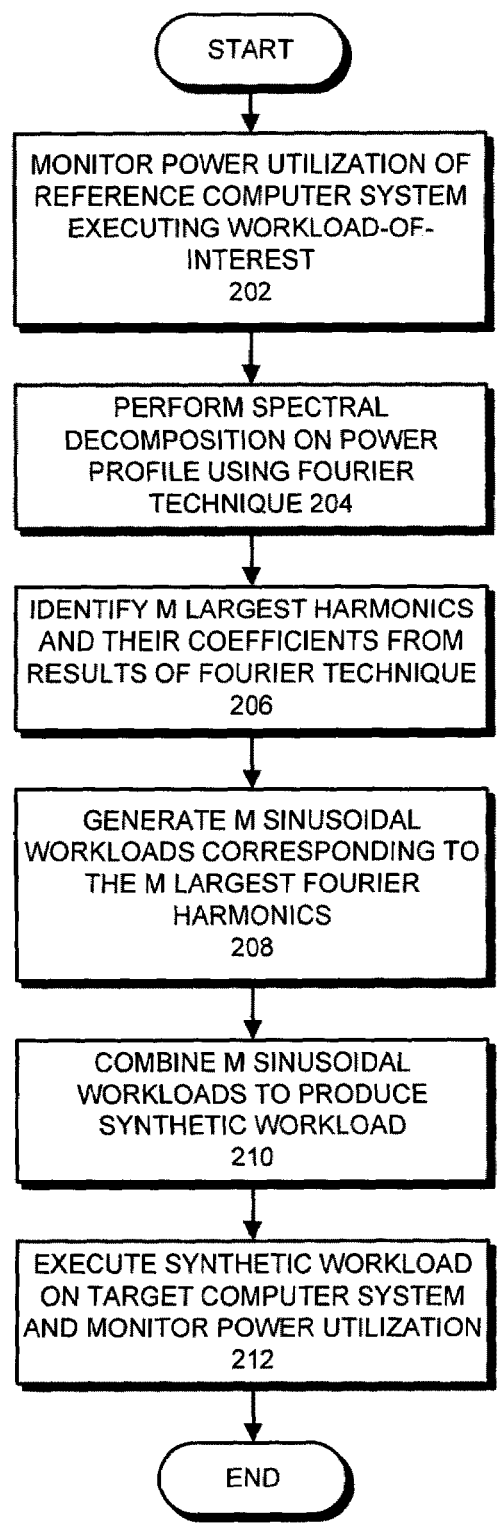
FIG. 2 presents a flow chart illustrating the process of estimating power utilization in accordance with an embodiment of the present invention.

The system that appears in FIG. 1 and the flow chart that appears in FIG. 2 illustrate the process of estimating the power utilization of a target computer system executing a workload-of-interest in accordance with an embodiment of the present invention. Referring to FIG. 1, a reference computer system 102 executes a workload-of-interest 100. While the workload-of-interest 100 is executing, power monitor 104 monitors the power utilization of reference computer system 102 to produce a power-utilization profile 106 (step 202 in FIG. 2).

A number of different techniques can be used to monitor the power utilization in step 202. For example, the simplest technique is to simply using a power meter interposed between the reference computer system and a power source to monitor the power utilization.

Another technique aggregates information from various voltage and current sensors within reference computer system 102 to estimate the total power utilization. More specifically, this can involve: periodically polling current sensors and associated voltage sensors within reference computer system 102 to generate dynamic traces of currents and associated voltages within reference computer system 102. The system then generates a dynamic trace of total power consumption of the computer system based on the dynamic traces of the currents and associated voltages. This process is described in more detail in U.S. patent application Ser. No. 11/195,014, entitled "Real-Time Power Harness," by inventors Kenny C. Gross, Kalyanaraman Vaidyanathan, Aleksey M. Urmanov, Keith A. Whisnant, and Steven F. Zwinger, filed 2 Aug. 2005. This Patent Application is hereby incorporated by reference to disclose details of how power utilization can be measured.

Yet another technique determines power utilization inferentially from telemetry signals, which are not directly related to currents and voltages. More specifically, the system monitors instrumentation signals within the reference computer system, wherein the instrumentation signals do not include corresponding current and voltage signals that can be used to directly compute power consumption. The system then estimates the power consumption for the computer system by inferring the power consumption from the instrumentation signals and from an inferential power model generated during a training phase. This process is described in more detail in U.S. patent application Ser. No. 11/205,924, entitled "Inferential Power Monitor without Voltage/Current Transducers," by inventors Kenny C. Gross, Kalyanaraman Vaidyanathan, and Ramakrishna C. Dhanekula, filed 17 Aug. 2005. This Patent Application is hereby incorporated by reference to disclose details of how power utilization can be inferred from such telemetry signals.

Next, referring back to FIG. 1, load synthesizer 108 generates synthetic workload 112 from power-utilization profile 106. This involves a number of operations. First, the system performs a spectral decomposition on the power-utilization profile using the Fourier technique (step 204 in FIG. 2). The system then identifies the M largest Fourier harmonics produced by the Fourier technique along with their corresponding coefficients (step 206 in FIG. 2). Next, the system generates M sinusoidal workloads corresponding to the M largest Fourier harmonics (step 208 in FIG. 2) and combines the M sinusoidal workloads to produce the synthetic workload 112 (step 210 in FIG. 2).

Next, the system executes the synthetic workload 112 on the target computer system 114. During this process, the system uses power monitor 116 to measure the power utilization of target computer system 114 while synthetic workload 112 is executing. This produces power utilization 118 for target computer system 114 (step 212 in FIG. 2), which serves as an estimate for the power that would be consumed by target computer system 114 if target computer system 114 were executing workload-of-interest 100.

EXAMPLES

Figure 3:
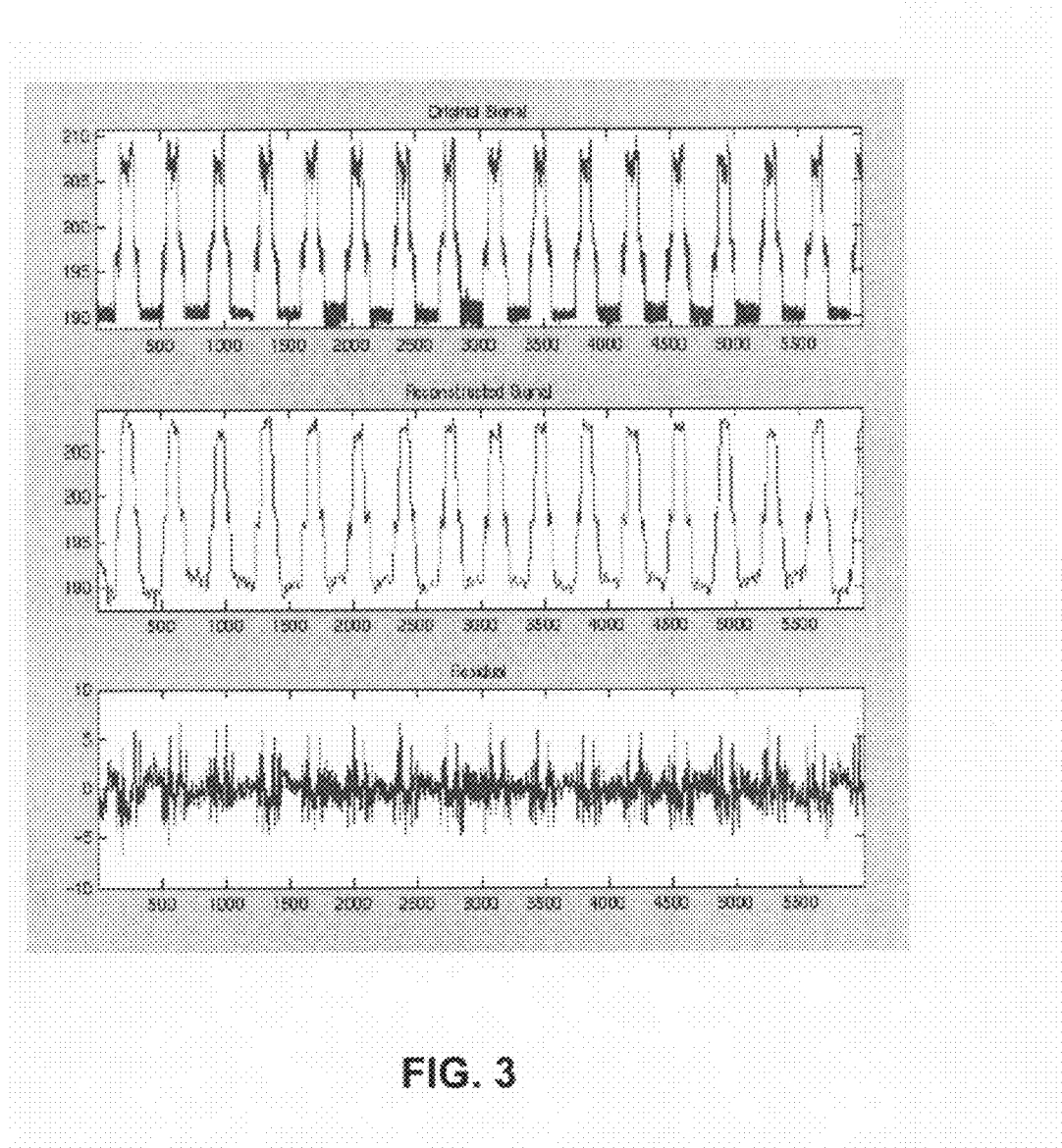
FIG. 3 illustrates how a power signal is reconstructed using 20 frequencies in accordance with an embodiment of the present invention.
Figure 4:
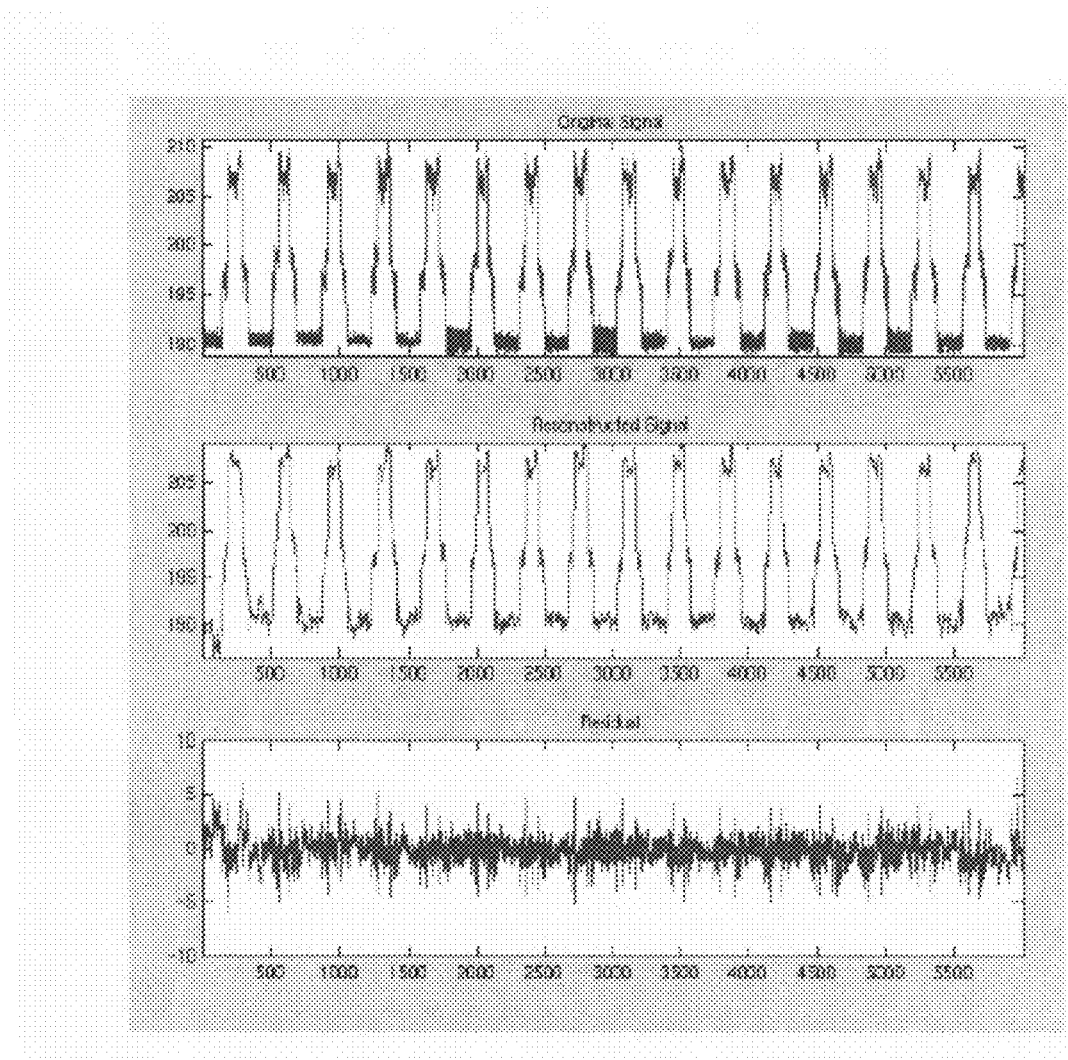
FIG. 4 illustrates how a power signal is reconstructed using 40 frequencies in accordance with an embodiment of the present invention.
Figure 5:
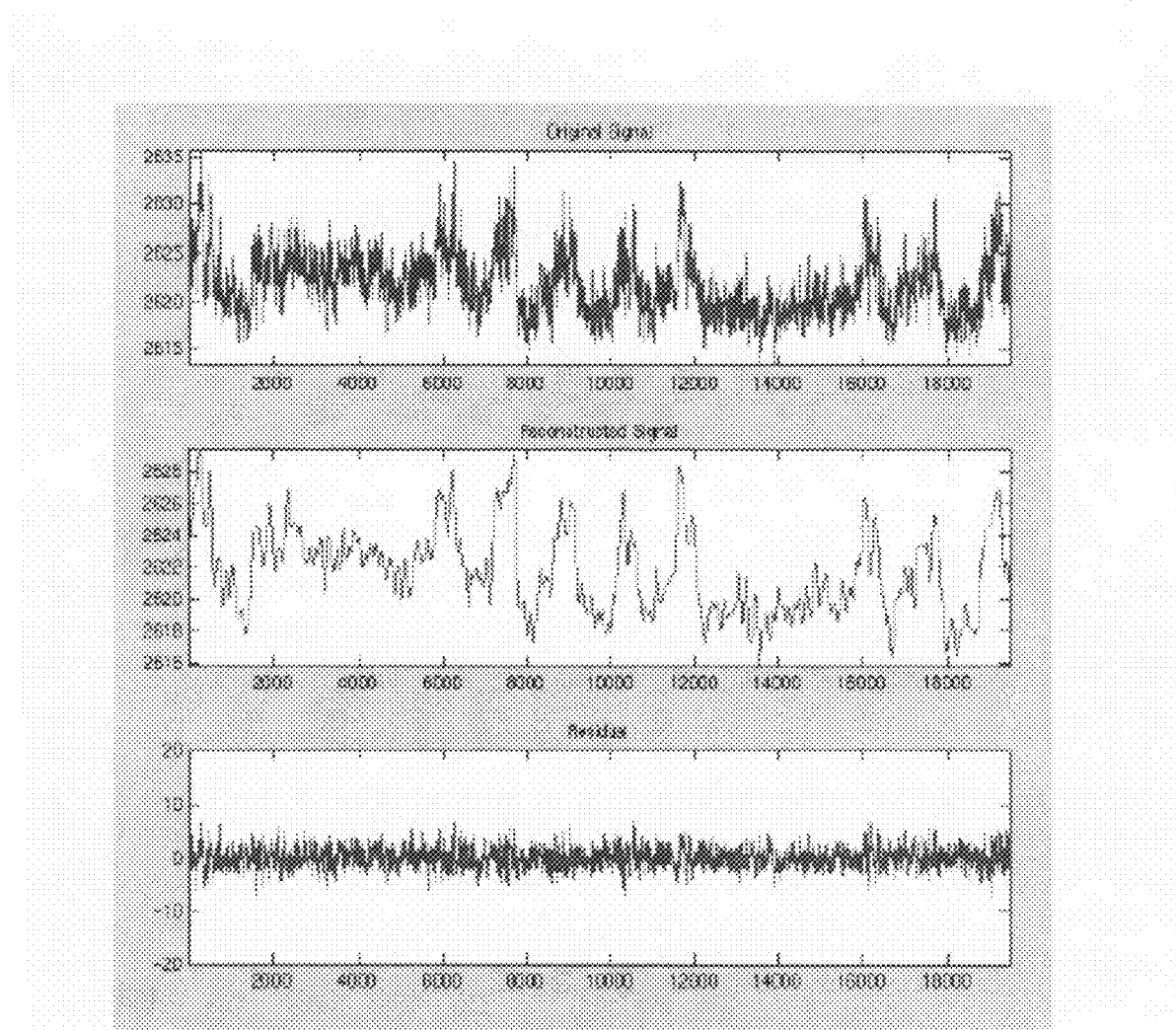
FIG. 5 illustrates how a power signal is reconstructed using 40 frequencies in accordance with an embodiment of the present invention.
Figure 6:
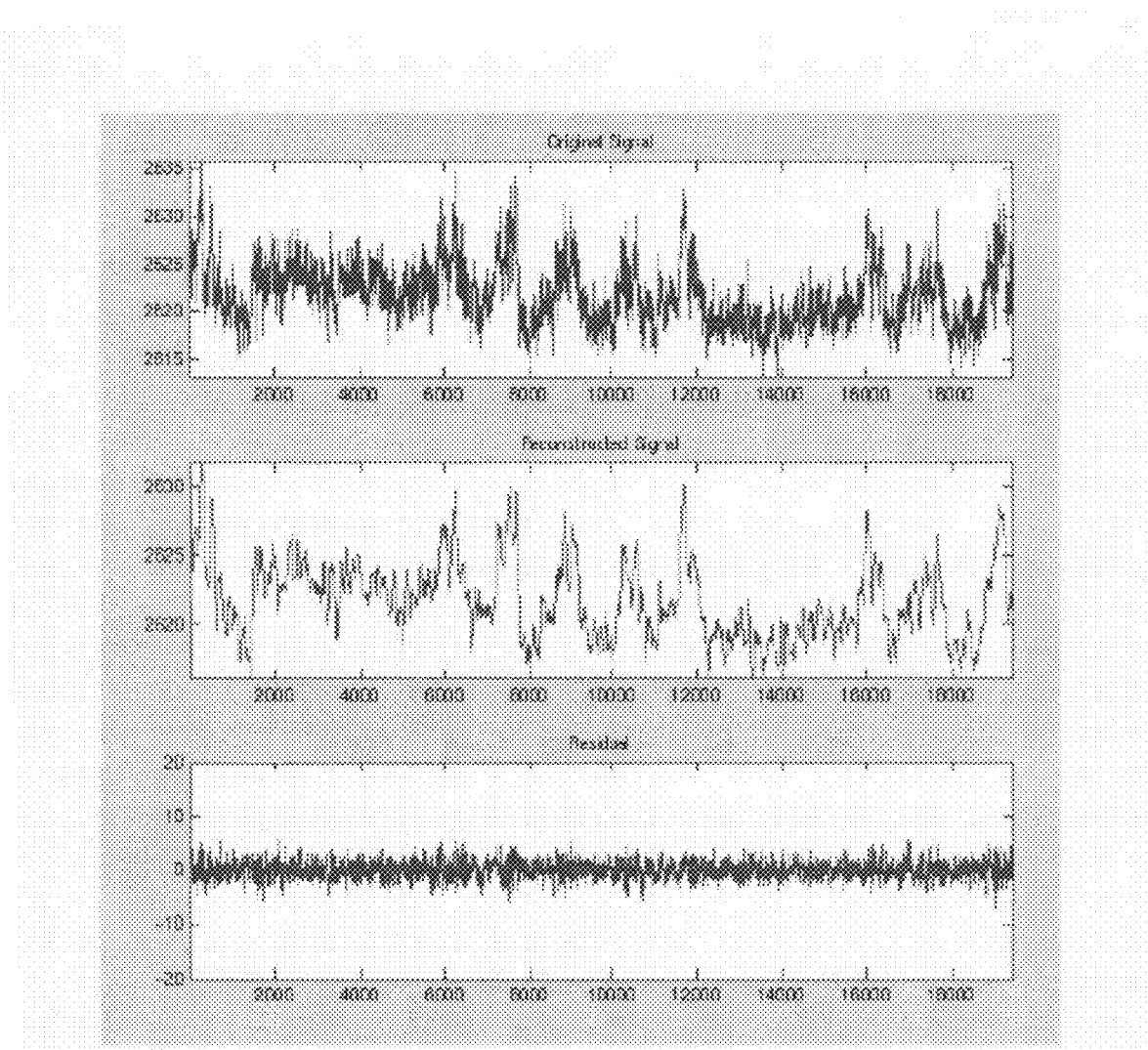
FIG. 6 illustrates how a power signal is reconstructed using 80 frequencies in accordance with an embodiment of the present invention.

The charts which appear in FIGS. 3-6 demonstrate the marginal improvement in accuracy obtained by varying the number of modes M in the Fourier decomposition. More specifically, FIG. 3 illustrates how a power signal is reconstructed using 20 frequencies. Similarly, FIGS. 4 and 5 illustrate how power signals are reconstructed using 40 frequencies. Finally, FIG. 6 illustrates how a power signal is reconstructed using 80 frequencies in accordance with an embodiment of the present invention. Note that as M is increased, the "residual function" (i.e. difference between the original customer workload and the synthesized Lab-machine workload) becomes smaller.

CONCLUSION

Duplicating customer workload dynamics is presently a very difficult task which involves porting the customer's software systems and data to a laboratory machine. One embodiment of the present invention teaches a novel way of synthesizing customer workload dynamics to any desired degree of accuracy without having to have access to customer source code or business-sensitive data.

The synthetic workload can be used in a number of ways. (1) The synthetic workload can be used to determine power utilization of the corresponding workload-of-interest on a range of server products to illustrate the expected "performance per watt" across range of server products. (2) The synthetic workload can be used to perform more realistic quality testing of server products without the need to port the customer's software and data.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for generating a synthetic workload to test power utilization in a computer system, comprising:
    monitoring power utilization of a reference computer system while the reference computer system executes a workload-of interest, wherein the monitoring process produces a power profile;
    determining characteristics of the workload-of-interest from the power profile; and
    using the determined characteristics to construct the synthetic workload, wherein, when the synthetic workload is executed on a target computer system, the synthetic workload has a power profile that closely matches the power profile of the reference computer system while the reference computer executes the workload-of-interest.

2. The method of claim 1,
    wherein determining characteristics of the workload-of-interest involves performing a spectral decomposition on the power profile to produce a set of coefficients; and
    wherein using the determined characteristics to construct the synthetic workload involves using the set of coefficients to construct the synthetic workload.

3. The method of claim 2,
    wherein performing the spectral decomposition involves using the Fourier technique; and
    wherein producing the set of coefficients involves producing coefficients for M largest Fourier harmonics produced by the Fourier technique.

4. The method of claim 3, wherein using the set of coefficients to construct the synthetic workload involves constructing a workload comprised of M sinusoidal workload ads corresponding to the M largest Fourier harmonics.

5. The method of claim 1, wherein monitoring the power utilization of the reference computer system involves:
    periodically polling current sensors and associated voltage sensors within the reference computer system to generate dynamic traces of currents and associated voltages within the reference computer system; and
    generating a dynamic trace of total power consumption of the reference computer system based on the dynamic traces of the currents and associated voltages.

6. The method of claim 1, wherein monitoring the power utilization of the reference computer system involves using a power meter interposed between the reference computer system and a power source to monitor the power utilization.

7. The method of claim 1, wherein monitoring the power utilization of the reference computer system involves:
    monitoring instrumentation signals within the reference computer system, wherein the instrumentation signals do not include corresponding current and voltage signals that can be used to directly compute power consumption; and
    estimating the power consumption for the computer system by inferring the power consumption from the instrumentation signals and from an inferential power model generated during a training phase.

8. The method of claim 1, further comprising estimating the power utilization of a target computer system by:
    executing the synthetic workload on the target computer system; and
    monitoring the power utilization of the target computer system while the synthetic workload is executing.

9. The method of claim 1,
    wherein monitoring the power utilization of the reference computer system additionally involves monitoring a relative mix between floating-point and integer operations as the reference computer system executes the workload-of-interest; and
    wherein constructing the synthetic workload involves using the relative mix information to synthesize separate floating-point and integer components of the synthetic workload.

10. A computer-readable storage medium storing instructions that when executed by a computer cause the computer to perform a method for generating a synthetic workload to test power utilization in a computer system, the method comprising:
    monitoring power utilization of a reference computer system while the reference computer system executes a workload-of interest, wherein the monitoring process produces a power profile;

determining characteristics of the workload-of-interest from the power profile; and using the determined characteristics to construct the synthetic workload, wherein, when the synthetic workload is executed on a target computer system, the synthetic workload has a power profile that closely matches the power profile of the reference computer system while the reference computer system executes the workload-of-interest.

11. The computer-readable storage medium of claim 10,
wherein determining characteristics of the workload-of-interest involves performing a spectral decomposition on the power profile to produce a set of coefficients; and
wherein using the determined characteristics to construct the synthetic workload involves using the set of coefficients to construct the synthetic workload.

12. The computer-readable storage medium of claim 11,
wherein performing the spectral decomposition involves using the Fourier technique; and
wherein producing the set of coefficients involves producing coefficients for M largest Fourier harmonics produced by the Fourier technique.

13. The computer-readable storage medium of claim 12, wherein using the set of coefficients to construct the synthetic workload involves constructing a workload comprised of M sinusoidal workloads corresponding to the M largest Fourier harmonics.

14. The computer-readable storage medium of claim 10, wherein monitoring the power utilization of the reference computer system involves:
periodically polling current sensors and associated voltage sensors within the reference computer system to generate dynamic traces of currents and associated voltages within the reference computer system; and
generating a dynamic trace of total power consumption of the reference computer system based on the dynamic traces of the currents and associated voltages.

15. The computer-readable storage medium of claim 10, wherein monitoring the power utilization of the reference computer system involves using a power meter interposed between the reference computer system and a power source to monitor the power utilization.

16. The computer-readable storage medium of claim 10, wherein monitoring the power utilization of the reference computer system involves:
monitoring instrumentation signals within the reference computer system, wherein the instrumentation signals do not include corresponding current and voltage signals that can be used to directly compute power consumption; and
estimating the power consumption for the computer system by inferring the power consumption from the instrumentation signals and from an inferential power model generated during a training phase.

17. The computer-readable storage medium of claim 10, further comprising estimating the power utilization of a target computer system by:
executing the synthetic workload on the target computer system; and
monitoring the power utilization of the target computer system while the synthetic workload is executing.

18. The computer-readable storage medium of claim 10,
wherein monitoring the power utilization of the reference computer system additionally involves monitoring a relative mix between floating-point and integer operations as the reference computer system executes the workload-of-interest; and
wherein constructing the synthetic workload involves using the relative mix information to synthesize separate floating-point and integer components of the synthetic workload.

19. An apparatus that generates a synthetic workload to test power utilization in a computer system, comprising:
a monitoring mechanism configured to monitor power utilization of a reference computer system while the reference computer system executes a workload-of interest, wherein the monitoring process produces a power profile;
an analysis mechanism configured to determine characteristics of the workload-of-interest from the power profile; and
a work-load-generation mechanism configured to use the determined characteristics to construct the synthetic workload, wherein, when the synthetic workload is executed on a target computer system, the synthetic workload has a power profile that closely matches the power profile of the reference computer system while the reference computer system executes the workload-of-interest.

20. The apparatus of claim 19,
wherein the analysis mechanism is configured to perform a spectral decomposition on the power profile to produce a set of coefficients; and
wherein the work-load-generation mechanism is configured to use the set of coefficients to construct the synthetic workload.

21. The apparatus of claim 19,
wherein the analysis mechanism is configured to use the Fourier technique to perform the spectral decomposition; and
wherein the analysis mechanism is configured to produce coefficients for M largest Fourier harmonics produced by the Fourier technique.

22. The apparatus of claim 21, wherein the work-load-generation mechanism is configured to construct a workload comprised of M sinusoidal workloads corresponding to the M largest Fourier harmonics.

* * * * *

UNITED STATES PATENT AND TRADEMARK OFFICE
CERTIFICATE OF CORRECTION

| | |
|---|---|
| PATENT NO. | : 7,487,058 B2 |
| APPLICATION NO. | : 11/725006 |
| DATED | : February 3, 2009 |
| INVENTOR(S) | : Kenny C. Gross et al. |

Page 1 of 1

It is certified that error appears in the above-identified patent and that said Letters Patent is hereby corrected as shown below:

In claim 4 (at column 6, line 16), please replace the words "workload ads" with the word --workloads-- so that the line reads: --a workload comprised of M sinusoidal workloads--.

Signed and Sealed this

Thirty-first Day of March, 2009

JOHN DOLL
*Acting Director of the United States Patent and Trademark Office*